United States Patent
Yow et al.

(10) Patent No.: US 7,868,449 B2
(45) Date of Patent: Jan. 11, 2011

(54) SEMICONDUCTOR SUBSTRATE AND METHOD OF CONNECTING SEMICONDUCTOR DIE TO SUBSTRATE

(75) Inventors: Kai Yun Yow, Petaling Jaya (MY); Poh Leng Eu, Petaling Jaya (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/471,409

(22) Filed: May 25, 2009

(65) Prior Publication Data

US 2010/0295169 A1    Nov. 25, 2010

(51) Int. Cl.
*H01L 23/04* (2006.01)
(52) U.S. Cl. ............. 257/698; 257/700; 257/706; 438/106
(58) Field of Classification Search ............ 257/698, 257/700, 706, E23.04, E23.042, E25.031, 257/E25.032; 438/106
See application file for complete search history.

(56) References Cited

U.S. PATENT DOCUMENTS

| | | | | |
|---|---|---|---|---|
| 6,400,573 | B1 * | 6/2002 | Mowatt et al. | 361/719 |
| 6,975,037 | B2 | 12/2005 | Farnworth et al. | |
| 7,485,489 | B2 * | 2/2009 | Bjorbell | 438/106 |
| 2006/0170098 | A1 * | 8/2006 | Hsu | 257/723 |
| 2008/0099911 | A1 * | 5/2008 | Machida | 257/723 |

\* cited by examiner

*Primary Examiner*—Theresa T Doan
(74) *Attorney, Agent, or Firm*—Charles Bergere

(57) ABSTRACT

A semiconductor substrate includes a substrate layer and a circuit film formed over the substrate layer. One or more openings are formed in the circuit film and the substrate layer. Conductive plates are formed over the circuit film at the peripheries of the openings. A semiconductor die is attached to the circuit film, below the openings with an adhesive material. A conductive material is disposed in the openings to electrically connect the semiconductor die to the conductive plates.

14 Claims, 8 Drawing Sheets

US 7,868,449 B2

1

SEMICONDUCTOR SUBSTRATE AND METHOD OF CONNECTING SEMICONDUCTOR DIE TO SUBSTRATE

BACKGROUND OF THE INVENTION

The present invention relates generally to semiconductor packages, and more specifically, to a method for connecting a semiconductor die to a substrate in semiconductor packages.

Various techniques are used for establishing an electrical connection between a semiconductor die and a substrate in a semiconductor package. One such technique is wirebonding, in which the semiconductor die is initially attached to a lead frame or a substrate. Thereafter, a gold or copper wire is used to form an interconnection between the semiconductor die and the substrate or the lead frame. However, wirebonding is an expensive process due to the high cost associated with the wires.

Wafer bumping, also known as solder bumping, is another known technique used for electrically connecting a semiconductor die to a substrate or a carrier, in flip-chip packaging. In wafer bumping, solder bumps are formed over bond pads of the semiconductor die. Thereafter, the substrate is placed over the semiconductor die such that the bond pads of the substrate are aligned with the bond pads of the die. Subsequently, the package is heated so that the solder bumps form an electrical connection between the semiconductor die and the substrate. However, wafer bumping process is also costly and time-consuming. It would be advantageous to be able to attach and electrically connect a die to a substrate with an inexpensive yet reliable process.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1A:
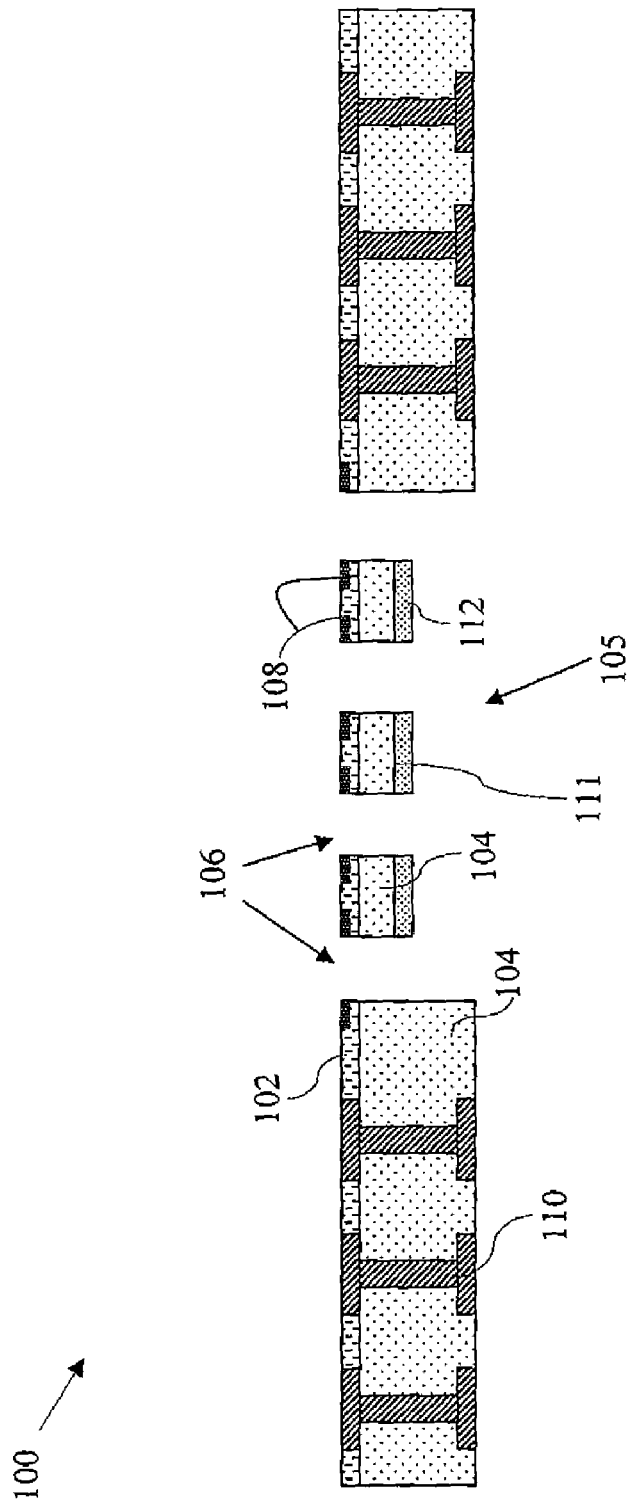
FIG. 1A an enlarged, schematic cross-sectional side view illustration of a semiconductor substrate in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a semiconductor substrate is provided. The substrate includes a circuit film deposited over it. One or more openings are formed through the circuit film and the substrate. One or more conductive plates are disposed or formed over a first surface of the circuit film, at peripheries of the openings. Further, one or more metallic contacts are formed through the first surface of the circuit film and the semiconductor substrate. Thereafter, one or more conductive tracks are disposed or formed over the first surface of the circuit film. The conductive tracks connect the conductive plates with the metallic contacts. An adhesive material is deposited on a second surface of the circuit film, below the substrate, to allow attachment of a semiconductor die to the circuit film.

In another embodiment of the present invention, a semiconductor package is provided. The semiconductor package includes a substrate layer with a circuit film deposited over it. One or more openings are formed through the circuit film and the substrate layer. Further, one or more conductive plates are disposed over a first surface of the circuit film, at peripheries of the openings. A conductive material is disposed in the openings and is in contact with the conductive plates. Thereafter, an adhesive material is deposited on a second surface of the circuit film. Subsequently, a semiconductor die is attached to the second surface using the adhesive material such that one or more bond pads of the semiconductor die align with the openings. The conductive material disposed in the openings electrically connects the bond pads with the conductive plates.

In yet another embodiment of the present invention, a method for attaching a semiconductor die to a substrate layer in a semiconductor package is provided. The substrate layer includes a circuit film deposited over it. The circuit film and the substrate layer are etched to form one or more openings through a first surface of the circuit film and the substrate layer. Thereafter, one or more conductive plates are placed over the first surface of the circuit film, at peripheries of the openings. Further, one or more metallic contacts are formed through the first surface of the circuit film and the substrate layer. In addition, one or more conductive tracks are formed over the first surface of the circuit film. The conductive tracks connect the conductive plates with the metallic contacts. Subsequently, an adhesive material is deposited on a second surface of the circuit film. The semiconductor die is attached to the second surface of the circuit film using the adhesive material such that one or more bond pads of the semiconductor die align with the openings. The one or more openings may be filled with a conductive material to establish an electrical contact between the bond pads and the conductive plates.

Embodiments of the present invention provide a semiconductor substrate to which a semiconductor die may be attached using an adhesive material. The semiconductor substrate has openings that are aligned with the bond pads of the semiconductor die, and a conductive material is disposed in the openings. The conductive material establishes an electrical connection between the semiconductor die and the substrate. This eliminates the need for wirebonding or wafer bumping. Since neither wire bonding nor wafer bumping are required, the overall manufacturing cost of the semiconductor package may be reduced and the manufacturing process becomes simple and fast. Further, the size of the semiconductor package may be reduced because no solder ball attachment is required and the die can be encapsulated after die attachment and solder printing. This enables low-profile packaging. Further, thermal fillers may be used that facilitate efficient heat dissipation.

Referring now to FIG. 1A, an enlarged schematic diagram illustrating a cross-sectional side view of a semiconductor substrate 100 in accordance with an embodiment of the present invention is shown. The semiconductor substrate 100 includes a circuit film 102 that is deposited or formed over a substrate layer 104. The circuit film 102 may comprise a multi-layered design within the substrate layer 104. The substrate layer 104 may comprise a ceramic or plastic layer. The substrate 100 also has a center cavity 105 that is sized and shaped to receive a semiconductor die, as will be discussed in more detail below. The width of the substrate layer 104 above the center cavity 105 is less as compared to its width around the center cavity 105. One or more openings 106 are formed through the circuit film 102 and the substrate layer 104 at the center cavity 105. One or more conductive plates 108 are formed over a first, top surface of the circuit film 102 at the peripheries of the openings 106. In addition, at the sections around the center cavity 105, one or more metallic contacts 110 are formed through the circuit film 102 and the substrate layer 104. At the center cavity 105, an adhesive material 112 is deposited on a second or bottom surface 111 of the circuit film 102 and the substrate layer 104. The adhesive material 112 is used to attach a semiconductor die (not shown) to the circuit film 102. The adhesive material 112 may be a die attach film (DAF) material.

Figure 1B:
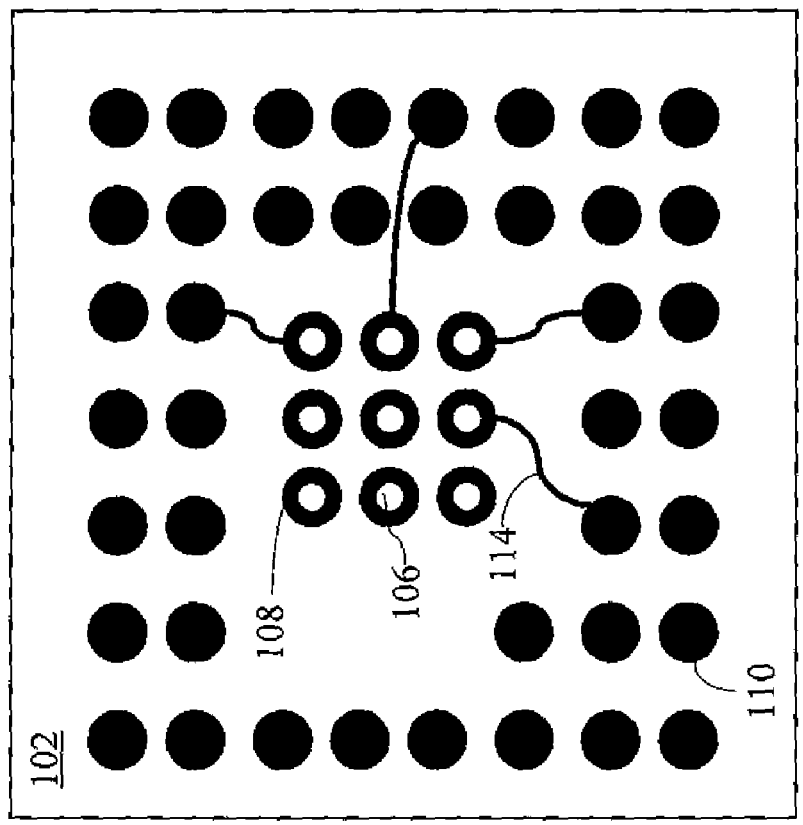
FIG. 1B is an enlarged, top plan view illustrating the semiconductor substrate of FIG. 1A.

Referring now to FIG. 1B, a schematic diagram illustrating a top plan view of the substrate 100 is shown. In addition to the elements shown in FIG. 1A, the substrate 100 may include one or more conductive tracks 114 formed on the first surface of the circuit film 102. The conductive tracks 114 connect various ones of the conductive plates 108 with the metallic contacts 110. In various embodiments of the present invention, the conductive plates 108, the metallic contacts 110 and the conductive tracks 114 may comprise copper. The conductive plates 108 also may be coated with nickel or gold. However, it will be understood by those of skill in the art that the conductive tracks 114 may be formed in various manners, such as with conductive inks.

Figure 2A:
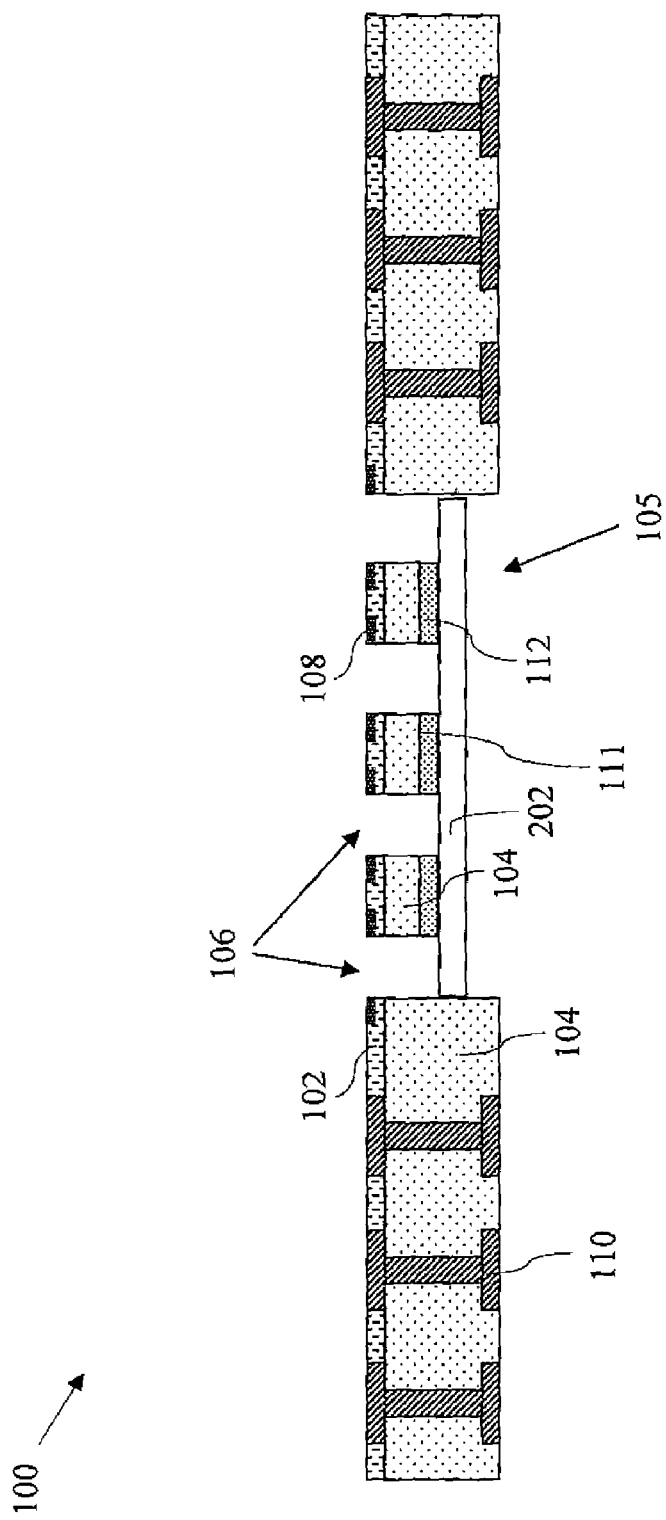
FIG. 2A is an enlarged, schematic cross-sectional side view illustration of the substrate of FIG. 1A with a die attached thereto in accordance with another embodiment of the present invention.

Referring now to FIG. 2A, a schematic diagram illustrating a cross-sectional side view of the substrate 100 having a semiconductor die 202 attached thereto in accordance with an embodiment of the present invention is shown. The semiconductor die 202 is attached to the substrate 100 with the adhesive material 112 in such a manner that the bond pads (not shown) of the semiconductor die 202 are aligned with the openings 106. In various embodiments the die 202 may be a processor, such as a MCF52277 microprocessor, which is commercially available from Freescale Semiconductor, Inc., the assignee of the instant patent application. However, it will be understood by those of skill in the art that the invention is not limited to the function or size of the die.

Figure 2B:
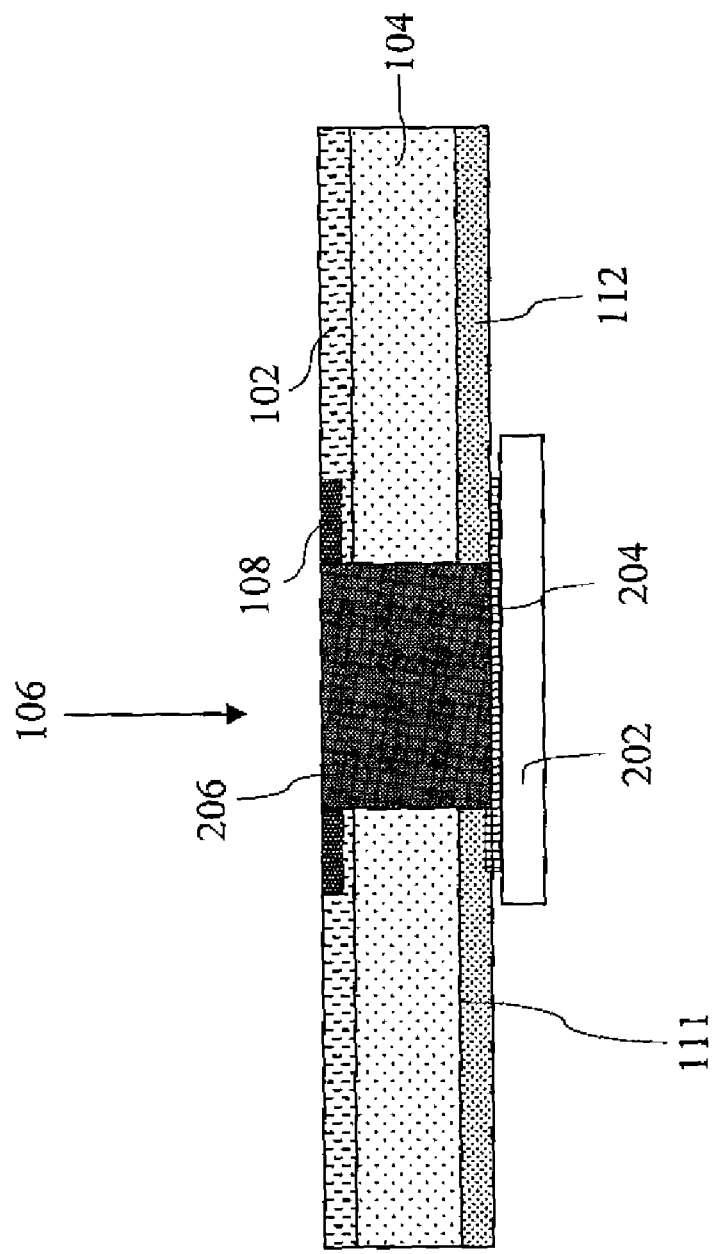
FIG. 2B a greatly enlarged schematic cross-sectional side view illustration of a portion of the substrate and die of FIG. 2A in accordance with another embodiment of the present invention.

Referring now to FIG. 2B, an enlarged schematic diagram illustrating a cross-sectional side view of a portion of the substrate 100 is shown. A die pad (or bonding pads) 204 is placed between the semiconductor die 202 and the circuit film 102, below the openings 106. A conductive material 206 is disposed in the openings 106. The conductive material 206 is in contact with the conductive plates 108 and electrically connects the bond pads of the semiconductor die 202 with the conductive plates 108.

In various embodiments of the present invention, the conductive material 206 may be a solder compound. The solder compound may be deposited using a solder printing process followed by a reflow process. Under bump metallization (UBM) may be performed on the die pad 204 using metals such as titanium, tungsten or copper. In an embodiment of the present invention, the openings 106 may be plated with a conductive material such as gold and nickel. The conductive material may be deposited over the inner walls of the openings 106 using processes such as chemical vapor deposition, electroplating, etc. In another embodiment of the present invention, the die pad 204 may be plated with a metal such as copper, nickel, gold or a combination of such metals.

Figure 2C:
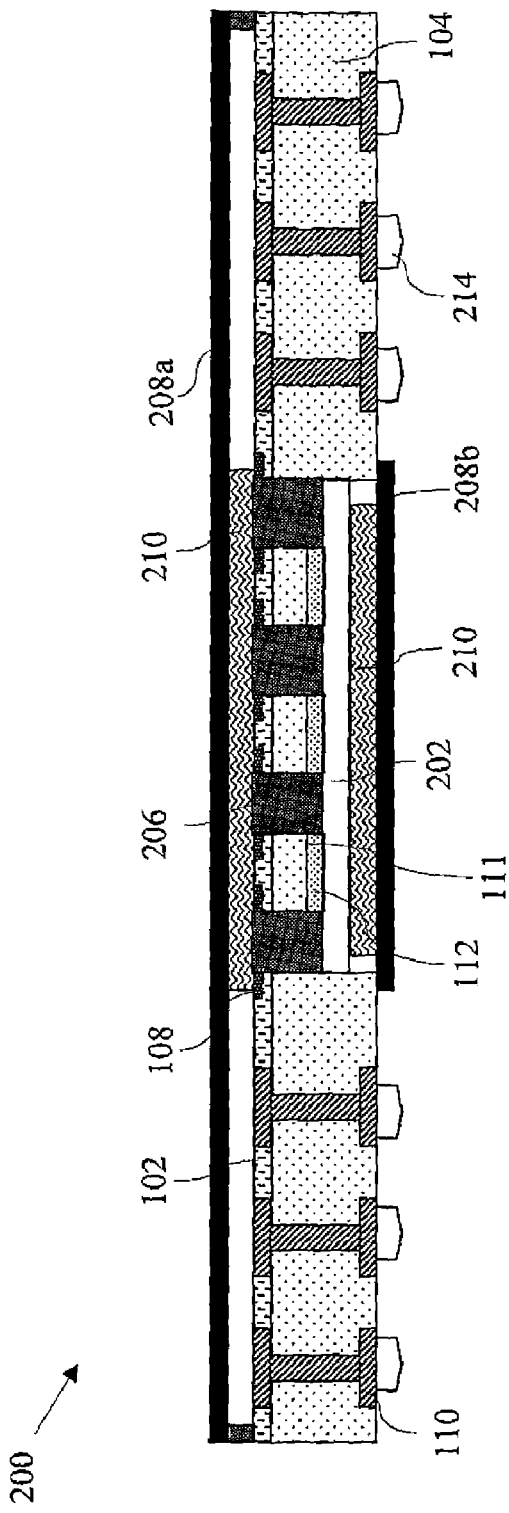
FIGS. 2C and 2D are enlarged schematic cross-sectional side views illustrating semiconductor packages in accordance with embodiments of the present invention.
Figure 2D:
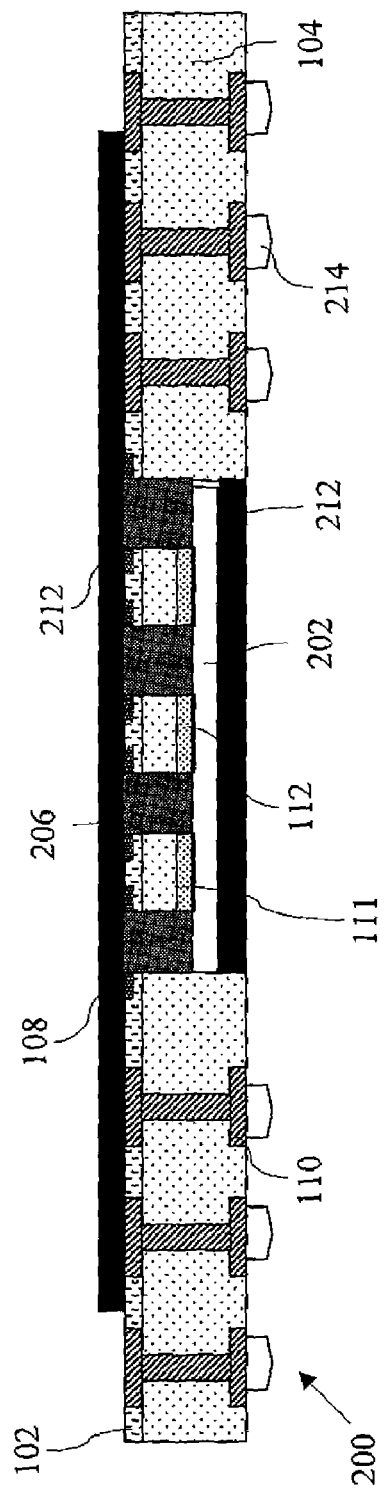

Referring now to FIGS. 2C and 2D, schematic diagrams illustrating cross-sectional side views of a semiconductor package 200 in accordance with an embodiment of the present invention are shown. In one embodiment, the semiconductor package 200 may include one or more heat spreaders 208a and 208b, as illustrated in FIG. 2C. The heat spreaders 208a and 208b may comprise copper lids. A thermal filler 210 may be disposed between the heat spreader 208a and the circuit film 102. The thermal filler 210 may also be disposed between the heat spreader 208b and the semiconductor die 202. The thermal filler 210 may comprise a commercially available non-conductive gel, which are known by those of skill in the art.

In another embodiment of the present invention, the semiconductor package 200 includes a mold compound 212, as illustrated in FIG. 2D. The mold compound 212 may be disposed over the circuit film 102 as well as the semiconductor die 202. In various embodiments of the present invention, solder bumps 214 may be formed over the metallic contacts 110 on the substrate layer 104.

Figure 3:
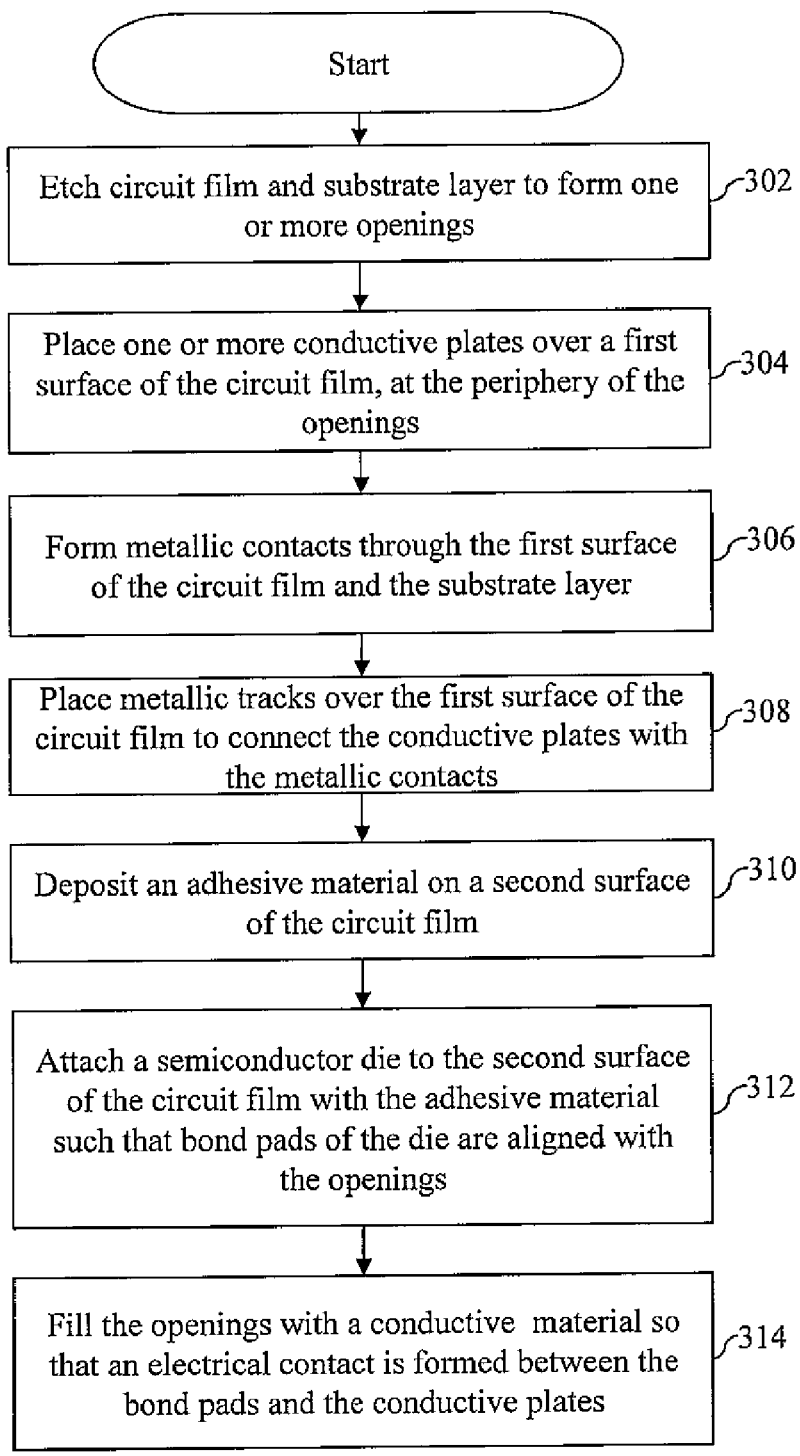
FIGS. 3 and 4 are flowcharts illustrating methods for attaching a semiconductor die to a semiconductor substrate in accordance with embodiments of the present invention.

Referring now to FIG. 3, a flowchart illustrating a method for attaching a semiconductor die to a semiconductor substrate in accordance with an embodiment of the present invention is shown. The semiconductor substrate includes a circuit film disposed over a substrate layer, as previously described. At step 302, the circuit film and the substrate layer are etched to form one or more openings through the circuit film and the substrate layer. At step 304, one or more conductive plates are formed over the first surface of the circuit film at peripheries of the openings. At step 306, one or more metallic contacts are formed through a first, top surface of the circuit film and the substrate layer. At step 308, one or more conductive tracks are formed over the first surface of the circuit film. The metallic tracks connect various ones of the conductive plates with ones of the metallic contacts. At step 310, an adhesive material is deposited on a second surface 111 of the circuit film and at step 312, the semiconductor die is attached to the second surface 111 of the circuit film using the adhesive material. The die is placed such that the bond pads of the semiconductor die are in alignment with the openings in the semiconductor substrate. At step 314, the openings are filled with a conductive material such that an electrical contact is formed between the bond pads and the conductive plates. The conductive material may be disposed in the holes using solder printing and reflow processes.

Figure 4:
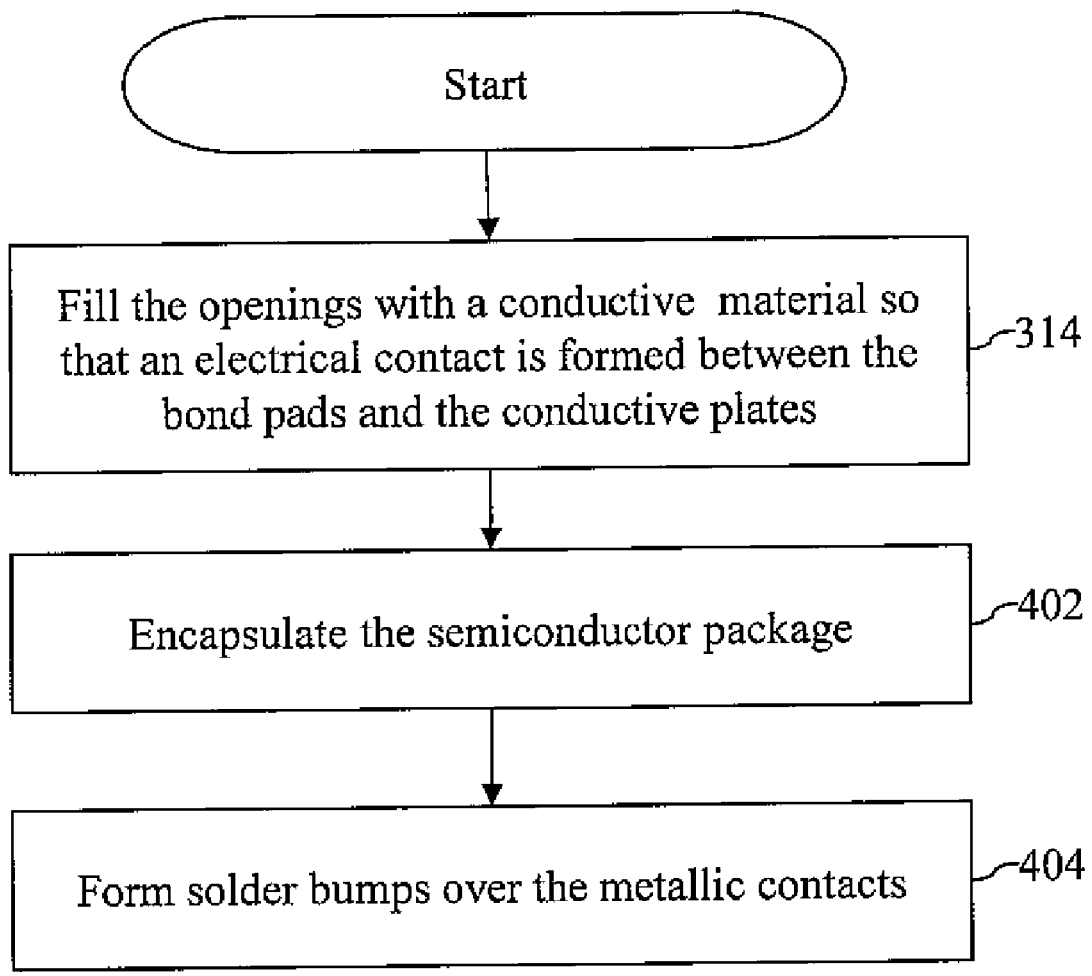

Referring now to FIG. 4, a flowchart illustrating some additional steps for forming a semiconductor package in accordance with an embodiment of the present invention is shown. At step 314, the openings are filled with a conductive material such that an electrical contact is formed between the bond pads and the conductive plates. It may be noted here that the method steps executed before step 314 are steps 302 to 312 described above with reference to FIG. 3. At step 402, an encapsulation process is performed. In various embodiments of the present invention, the encapsulation process may comprise the use of either or both of a heat spreader and a mold compound, such as described above in conjunction with FIGS. 2C and 2D. At step 404, solder bumps are formed over the metallic contacts on the substrate layer.

Figure 5B:
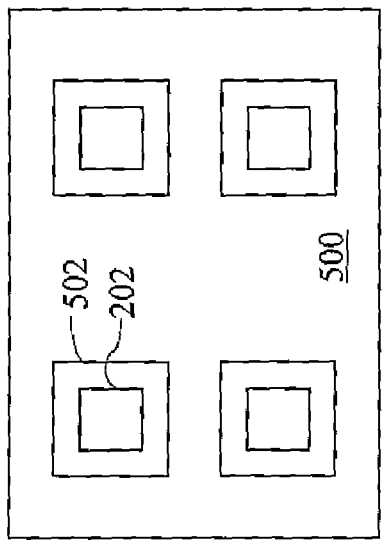
FIGS. 5A-5D are schematic diagrams illustrating a method of fabricating semiconductor packages in accordance with an exemplary embodiment of the present invention.
Figure 5C:
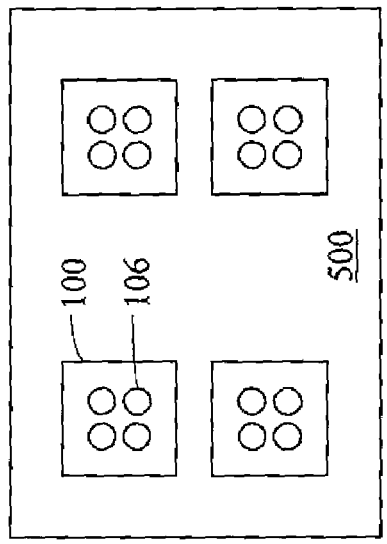
Figure 5A:
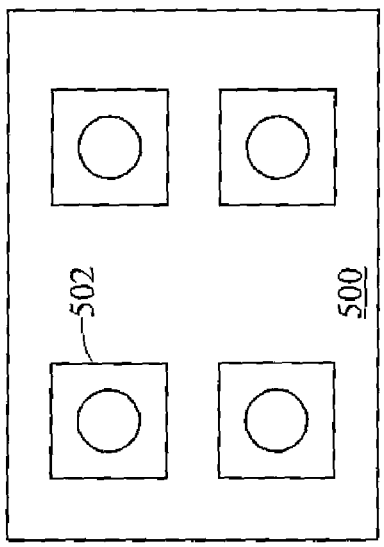

Referring now to FIGS. 5A-5D, schematic diagrams illustrating a method of assembling the semiconductor package 200 in accordance with an exemplary embodiment of the present invention are shown. As illustrated in FIG. 5A, a jig 500 with multiple pockets 502 is provided. The jig 500 rests on a pedestal (not shown). The jig 500 travels to a station for die placement. As illustrated in FIG. 5B, the semiconductor dies 202 are placed in the pockets 502. The dies 202 are placed top-up (pads down).

Figure 5D:
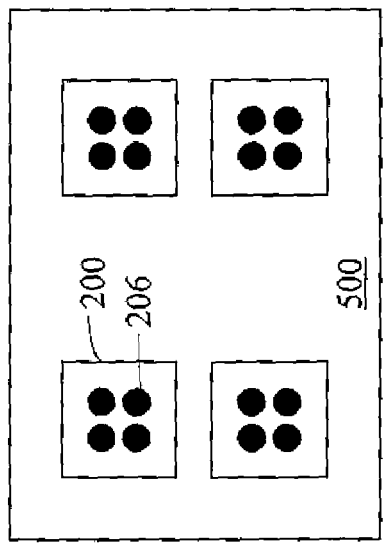

Thereafter, as illustrated in FIG. 5C, the semiconductor substrate 100 is placed over the semiconductor die 202. The semiconductor dies 202 and substrate 100 are aligned by way of the pedestals such that the bond pads (not shown) of the semiconductor die 202 are aligned with the openings 106 of the semiconductor substrate 100. Subsequently, as illustrated in FIG. 5D, a conductive material 206 is disposed in the openings 106 such as by solder printing and reflow processes.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A semiconductor substrate, comprising:
   a substrate layer having first and second major surfaces and a center cavity disposed in the second major surface;
   a circuit film deposited over the first major surface of the substrate layer, wherein the circuit film has a first surface and wherein one or more openings are formed through the first surface of the circuit film and the substrate layer at the center cavity;
   one or more conductive plates disposed over the first surface of the circuit film at peripheries of the openings;
   one or more metallic contacts formed through the first surface of the circuit film and the substrate layer;
   one or more conductive tracks formed on the first surface of the circuit film, wherein the conductive tracks connect the conductive plates with the metallic contacts; and
   an adhesive material disposed on the second major surface of the substrate layer and within the center cavity, the adhesive material for attaching a semiconductor die to the circuit film, wherein bond pads on the die are aligned with the openings for providing electrical connection of the bond pads with the conductive plates.

2. The semiconductor substrate of claim 1, wherein the adhesive material comprises a die attach film.

3. The semiconductor substrate of claim 1, wherein the substrate layer comprises at least one of a ceramic material and a plastic material.

4. A semiconductor package, comprising:
   a substrate layer having first and second major surfaces and a center cavity disposed in the second major surface;
   a circuit film deposited over the first major surface of the substrate layer, wherein one or more openings are formed through the circuit film and the substrate layer at the center cavity;
   one or more conductive plates disposed over a first surface of the circuit film at peripheries of the openings;
   a conductive material disposed in the openings and in contact with the conductive plates;
   an adhesive material deposited on the second major surface of the substrate and within the center cavity; and
   a semiconductor die attached to the second major surface of the substrate at the center cavity with the adhesive material, wherein one or more bond pads of the semiconductor die are aligned with the openings, and wherein the conductive material disposed in the openings electrically connects the bond pads with the conductive plates.

5. The semiconductor package of claim 4, wherein the substrate layer further comprises one or more metallic contacts formed through the first surface of the circuit film and the substrate layer.

6. The semiconductor package of claim 5, further comprising one or more conductive tracks formed on the first surface of the circuit film, wherein the conductive tracks electrically connect the conductive plates with the metallic contacts.

7. The semiconductor package of claim 6, wherein at least one of the conductive plates, the metallic contacts and the conductive tracks comprises copper.

8. The semiconductor package of claim 5, further comprising a plurality of solder bumps respectively formed over each of the metallic contacts on the substrate layer.

9. The semiconductor package of claim 4, further comprising a die pad located between the semiconductor die and the substrate layer and below the openings.

10. The semiconductor package of claim 4, wherein the adhesive material comprises a die attach film.

11. The semiconductor package of claim 4, wherein the substrate layer comprises at least one of a ceramic and a plastic material.

12. The semiconductor package of claim 4, wherein the semiconductor package includes a heat spreader.

13. The semiconductor package of claim 12, further comprising a first thermal filler disposed between the heat spreader and the semiconductor die.

14. The semiconductor package of claim 12, further comprising a second thermal filler disposed between the heat spreader and the first surface of the circuit film.

* * * * *